(12) United States Patent
Pourchet et al.

(10) Patent No.: US 11,011,687 B1
(45) Date of Patent: May 18, 2021

(54) MICRO LIGHT EMITTING DIODE WITH REMNANTS OF FABRICATION SUBSTRATE FOR STRUCTURAL SUPPORT

(71) Applicant: Facebook Technologies, LLC, Menlo Park, CA (US)

(72) Inventors: Allan Pourchet, Cork (IE); Pooya Saketi, Cork (IE); Daniel Brodoceanu, Saarbrucken (DE); Oscar Torrents Abad, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/892,313

(22) Filed: Feb. 8, 2018

(51) Int. Cl.
| | | |
|---|---|---|
| *H01L 33/60* | (2010.01) | |
| *H01L 33/00* | (2010.01) | |
| *H01L 33/38* | (2010.01) | |
| *H01L 33/62* | (2010.01) | |
| *H01L 33/06* | (2010.01) | |
| *H01L 33/32* | (2010.01) | |
| *H01L 25/075* | (2006.01) | |

(52) U.S. Cl.
CPC .......... *H01L 33/60* (2013.01); *H01L 25/0753* (2013.01); *H01L 33/007* (2013.01); *H01L 33/0093* (2020.05); *H01L 33/06* (2013.01); *H01L 33/32* (2013.01); *H01L 33/38* (2013.01); *H01L 33/62* (2013.01); *H01L 2933/0058* (2013.01)

(58) Field of Classification Search
CPC ..... H01L 33/60; H01L 33/0093; H01L 33/38; H01L 33/007; H01L 33/62; H01L 33/32; H01L 25/0753; H01L 33/06; H01L 2933/0058
See application file for complete search history.

(56) References Cited

U.S. PATENT DOCUMENTS

| | | | |
|---|---|---|---|
| 7,221,044 B2* | 5/2007 | Fan ........................ | H01L 27/153 257/676 |
| 2011/0260211 A1* | 10/2011 | Cheng ................... | H01L 33/007 257/103 |
| 2011/0294240 A1* | 12/2011 | Kim ...................... | H01L 25/0753 438/16 |
| 2016/0020353 A1* | 1/2016 | Chu ...................... | H01L 31/1035 257/21 |
| 2018/0226543 A1* | 8/2018 | Masui ..................... | H01L 33/46 |
| 2018/0371315 A1* | 12/2018 | Hofmann ............... | C09K 11/08 |

* cited by examiner

*Primary Examiner* — Benjamin Tzu-Hung Liu
(74) *Attorney, Agent, or Firm* — Fenwick & West LLP

(57) ABSTRACT

A light emitting diode (LED) device includes a semiconductor layer and one or more portions of a wafer on which the semiconductor layer was formed, the other portions of the wafer having been removed by an etching process. The semiconductor layer has a front surface that includes a light emitting area. The remnants of the wafer on which the semiconductor layer are disposed on the front surface of the semiconductor layer and define a trench. The trench is positioned such that the light emitting area emits light into the trench. The remnants of the wafer make the LED device more robust and the trench may reduce crosstalk with adjacent LED devices.

18 Claims, 12 Drawing Sheets

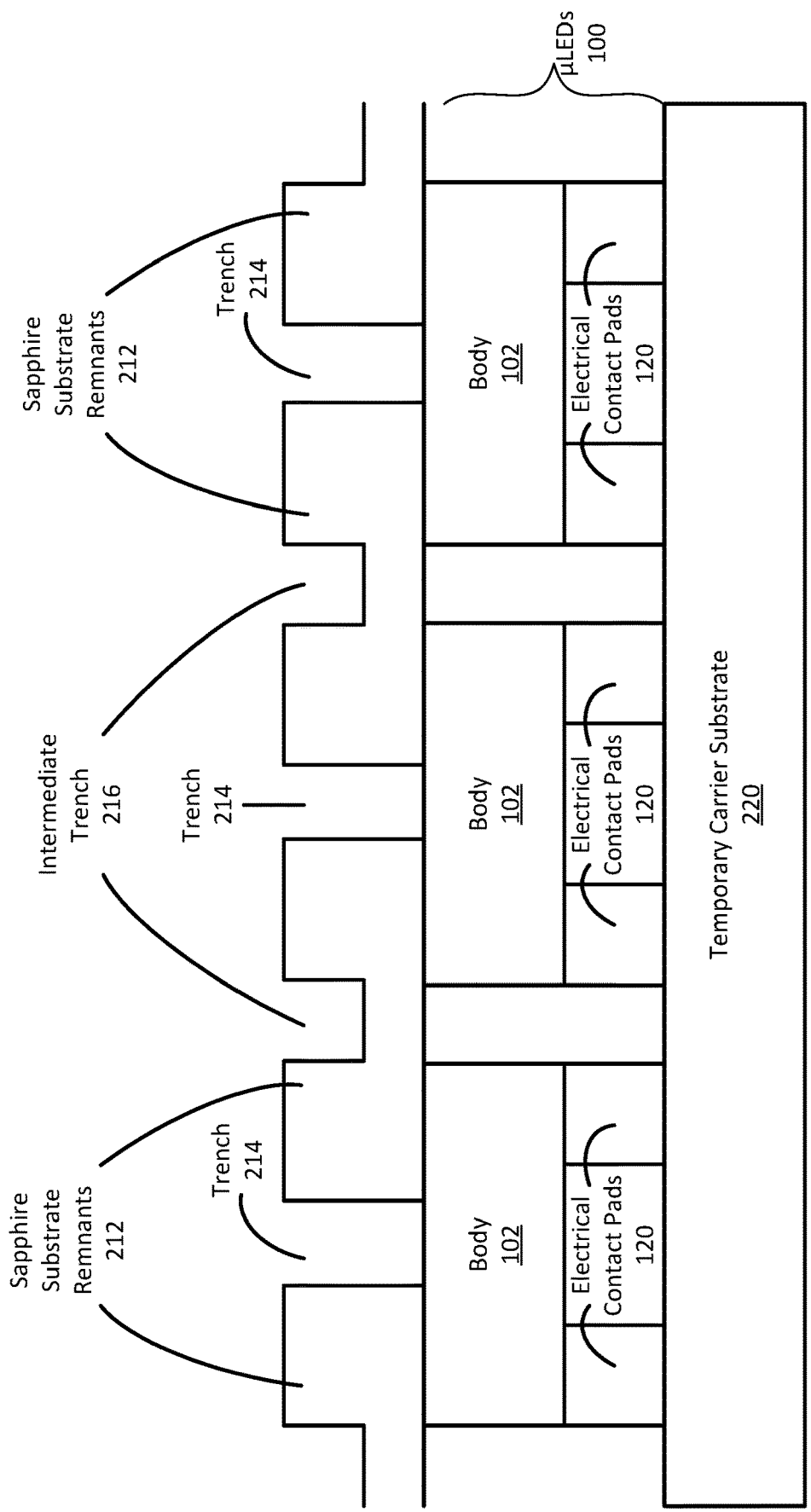

MICRO LIGHT EMITTING DIODE WITH REMNANTS OF FABRICATION SUBSTRATE FOR STRUCTURAL SUPPORT

BACKGROUND

1. Technical Field

The subject matter described relates generally to micro light-emitting diodes (μLEDs), and in particular to a method of production in which the μLEDs retain some of the sapphire substrate used during manufacture.

2. Background Information

A μLED is a small (e.g., microscopic) light-emitting diode (LED). Displays using μLEDs are an emerging technology. Compared to liquid crystal display (LCD) technology, μLED display devices offer improved contrast, faster response time, and lower energy consumption.

Typically, μLEDs are manufactured in bulk on a fabrication substrate, with each μLED on the fabrication substrate producing the same color when activated. Thus, in order to make a color display, a given μLED must be transferred from the fabrication substrate to a target substrate in combination with μLEDs of other colors. In some cases, the μLEDs are transferred from the fabrication substrate to a temporary carrier substrate, and then transferred from the temporary carrier substrate to the target substrate. For example, a pixel can be formed by creating a group with one red, one blue, and one green μLED positioned in close proximity to each other. The process of transferring the μLEDs to the target substrate is referred to as "pick and place" and may involve a tool physically picking the μLED off the fabrication substrate or the temporary carrier substrate, and putting it in the desired location on the target substrate. However, the picking and placing operation may place strain on the μLED, and consequently results in a proportion of the μLEDs breaking during transfer. This reduces manufacture efficiency and increases costs.

BRIEF DESCRIPTION OF THE DRAWINGS

Figure (FIG.) 1 is a simplified schematic diagram of a μLED, in accordance with one embodiment.

FIG. 5 illustrates a set of μLEDs that remain connected by remnants of a sapphire substrate after the etching process, in accordance with an alternative embodiment.

DETAILED DESCRIPTION

The Figures and the following description describe certain embodiments by way of illustration only. One skilled in the art will readily recognize from the following description that alternative embodiments of the structures and methods may be employed without departing from the principles described. Reference will now be made to several embodiments, examples of which are illustrated in the accompanying figures. It is noted that wherever practicable similar or like reference numbers are used in the figures to indicate similar or like functionality.

In various embodiments, a set of μLEDs is fabricated on a fabrication substrate (e.g., a sapphire substrate). Rather than removing all of the fabrication substrate (e.g., using laser lift off), the fabrication substrate is selectively etched to remove the portions that are over the light emitting area of each μLED to form a trench. The fabrication substrate may also be removed from the areas between μLEDs to singulate the μLEDs. The remaining portions of the fabrication substrate make the μLEDs more mechanically robust and less vulnerable to damage during transfer to a target substrate (e.g., during a pick and place operation). The remaining portions of the fabrication substrate can also reduce crosstalk between adjacent μLEDs in a display because some of the light is reflected at the boundary between the remaining portions of the fabrication substrate and air, progressing the light within the trench formed by the remaining portions of the fabrication substrate.

The fabrication substrate described herein refers to a substrate on which μLEDs are fabricated. The fabrication substrate may be made of materials such as sapphire or glass.

Example μLED Structure

Figure 1:
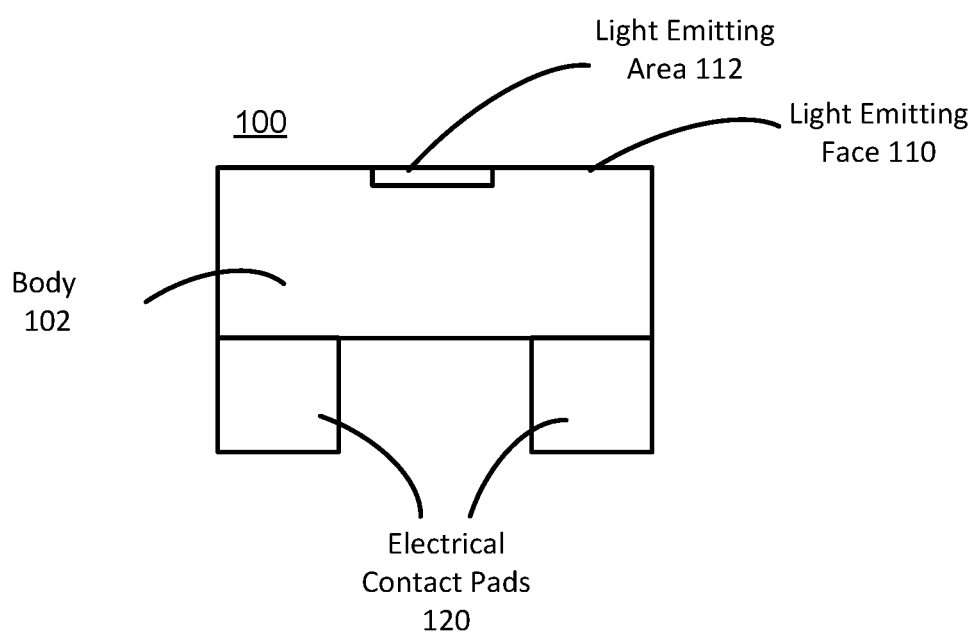

Figure (FIG. 1 illustrates a simplified schematic diagram of a μLED 100, in accordance with one embodiment. The μLED 100 shown includes a body 102. The body 102 includes a semiconductor layer (e.g., an N doped gallium nitride layer or a P doped gallium nitride layer) and various other elements, such as a quantum well, an electron spreading layer, an electron blocking layer, or the like. The body has a light emitting face 110 that includes a light emitting area 112 in the central portion of the light emitting face 110. Light emanates from the light emitting area 112 when the μLED 100 is activated. In a typical embodiment, the light emitting area 112 is less than 2,000 μm². However, larger light emitting areas 112 may be used. Although the light emitting area 112 is shown inset into the light emitting face 110, this is to illustrate its location rather than to indicate it is a physically separate component.

In addition, the μLED 100 includes a pair of electrical contact pads 120. During operation, the electrical contact pads 120 connect the μLED 100 to a display substrate (not shown). FIG. 1 is a simplified representation and understand the additional structure that is required to form a functioning μLED 100.

Figure 2A:
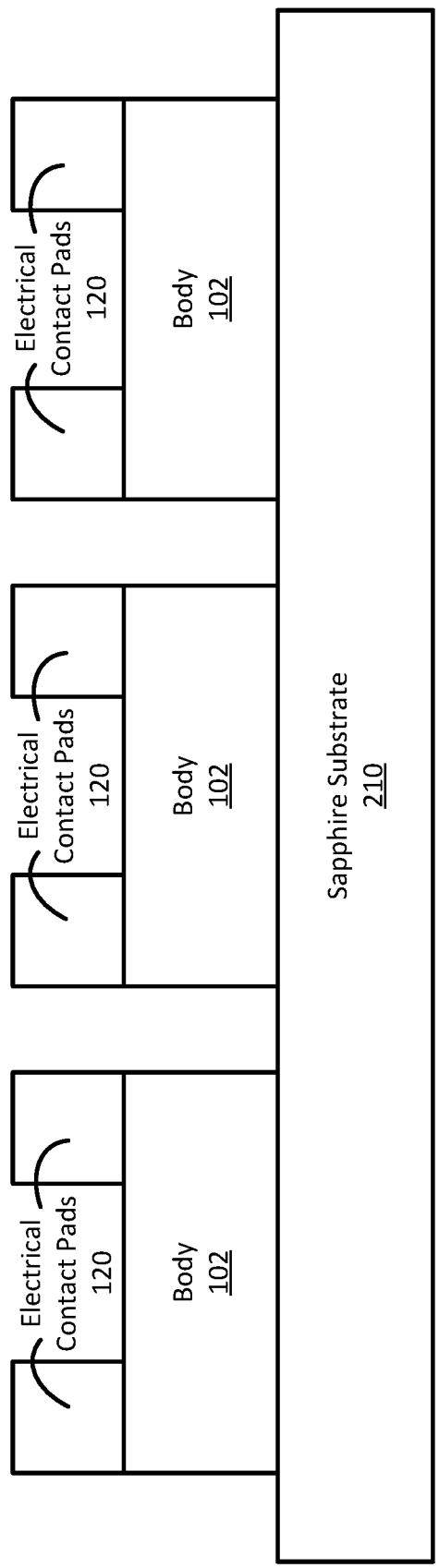
FIGS. 2A through 2C illustrate a set of μLEDs at different stages of fabrication using a sapphire etching process, in accordance with one embodiment.
Figure 2B:
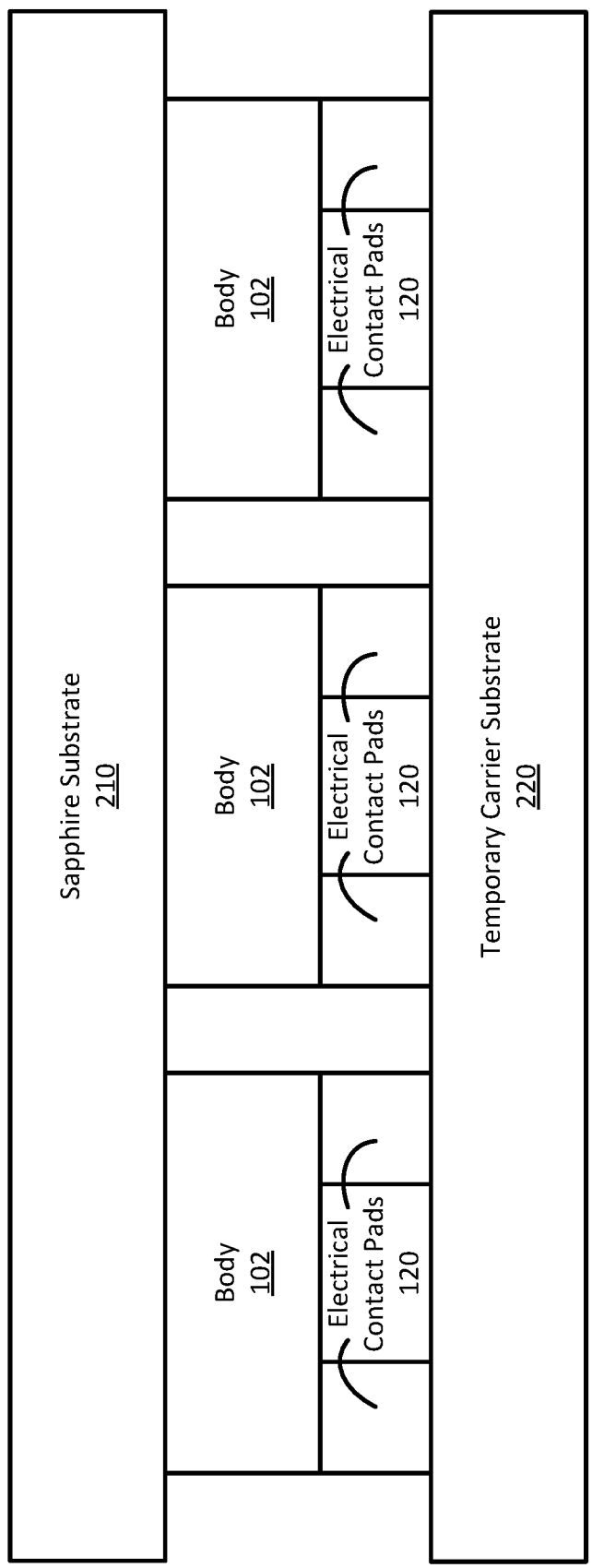
Figure 2C:
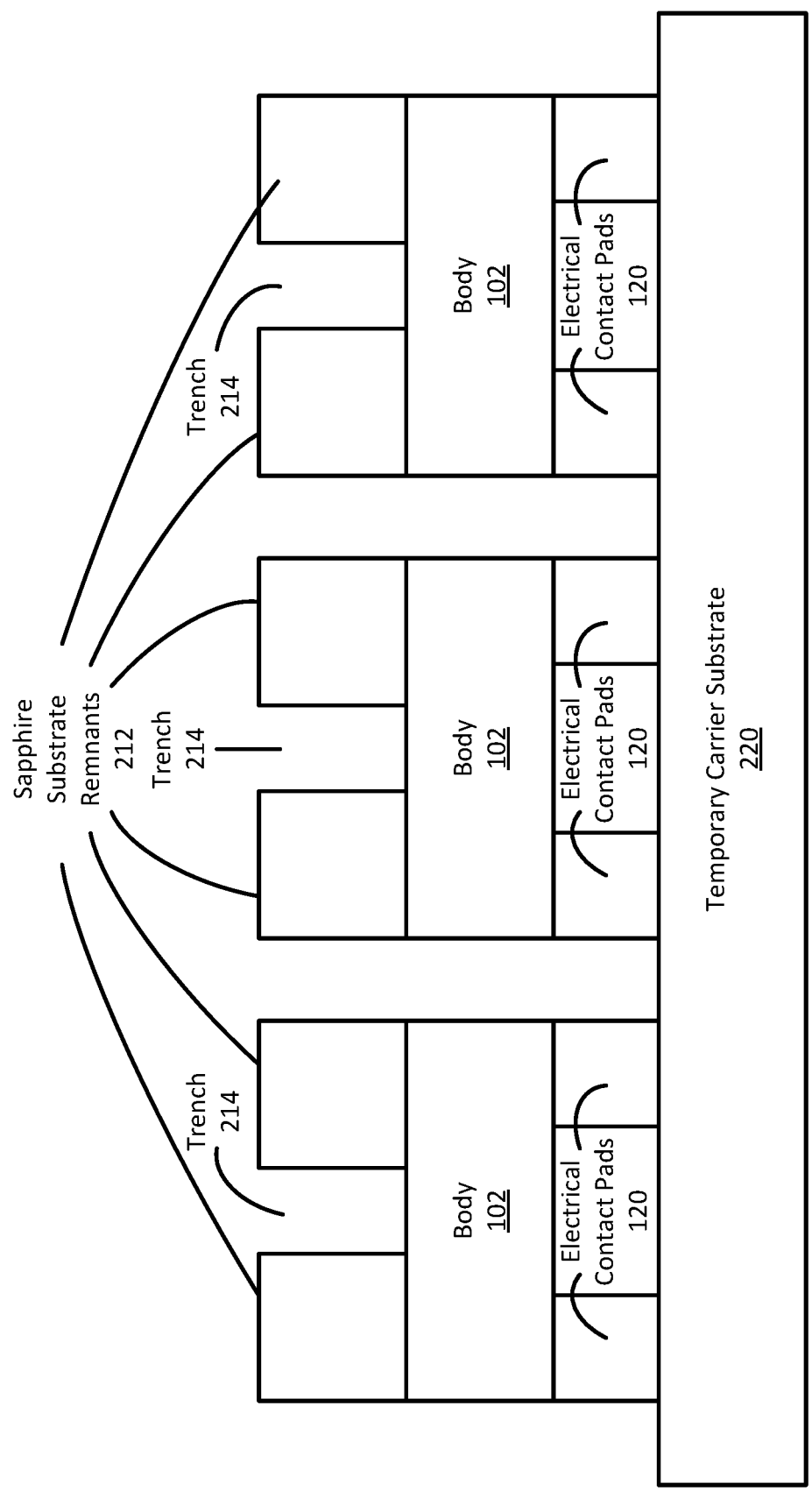

FIGS. 2A through 2C illustrate a set of μLEDs at different stages of fabrication using a sapphire etching process, in accordance with some embodiments. Like FIG. 1, these figures show a simplified μLED structure for illustrative purposes. Although FIGS. 2A through 2C show just three μLEDs 100 being fabricated, in practice, a single sapphire substrate 210 can include many (e.g., hundreds or thousands of) μLEDs in a two-dimensional matrix.

In FIG. 2A, the basic structure of the μLEDs 100 has been formed, but fabrication is not complete. The basic structure of each μLED 100 includes a body 102 that has been formed on the sapphire substrate 210 used as the fabrication substrate. A pair of electrical contact pads 120 have been formed on the body 102.

In FIG. 2B, the sapphire substrate 210 and the basic structure of the μLEDs 100 have been placed on a temporary carrier substrate 220. The electrical contact pads 120 contact the temporary carrier substrate 220. Thus, the basic structures of the μLEDs 100 are sandwiched between the sapphire substrate 210 and the temporary carrier substrate 220. In some embodiments, polymer or other material is placed between the temporary carrier substrate 220 and the μLEDs 100 to secure the μLEDs to the temporary carrier substrate 220.

In FIG. 2C, the sapphire substrate 210 has been etched. Thus, portions of the sapphire substrate 210 remain as remnants 212. In the embodiment shown in FIG. 2C, the portions of the sapphire substrate 210 over the light emitting areas 112 of the μLEDs have been removed, forming trenches 214. The sapphire has also been removed from between the μLEDs 100, singulating the set of μLEDs. In one embodiment, the sapphire substrate 210 is etched by irradiating the portions to be removed with an infrared (IR) laser and then dipping the wafer in hydrofluoric acid (HF). In other embodiments, alternative etching methods may be used.

Regardless of how the sapphire substrate remnants 212 are formed, they provide support to the body 102 making the μLEDs 100 more mechanically robust. Thus, the μLEDs 100 are less likely to be damaged during transfer to a target substrate (e.g., via pick and place) than if the sapphire substrate 210 were completely removed. Another advantage of this approach is that it may allow multiple μLEDs 100 (e.g., a full row of μLEDs of a given color) to be transferred together. This can reduce the number of pick and place cycles as well as preserve the precise lateral alignment of the μLEDs 100 from the original substrate.

In some embodiments, the sapphire substrate remnants 212 reduce crosstalk between adjacent μLEDs 100. The light emitting area 112 of each μLED 100 is at the bottom of a trench 214 formed by the sapphire substrate remnants 212. Consequently, light emitted at an angle will be incident on the interface between the trench 214 and one of the sapphire substrate remnants 212. According to the Fresnel equations, a portion of this light will be refracted and the remainder is reflected. Thus, the reflected light remains within the trench 214, reducing the amount of crosstalk between adjacent μLEDs 100.

Figure 3A:
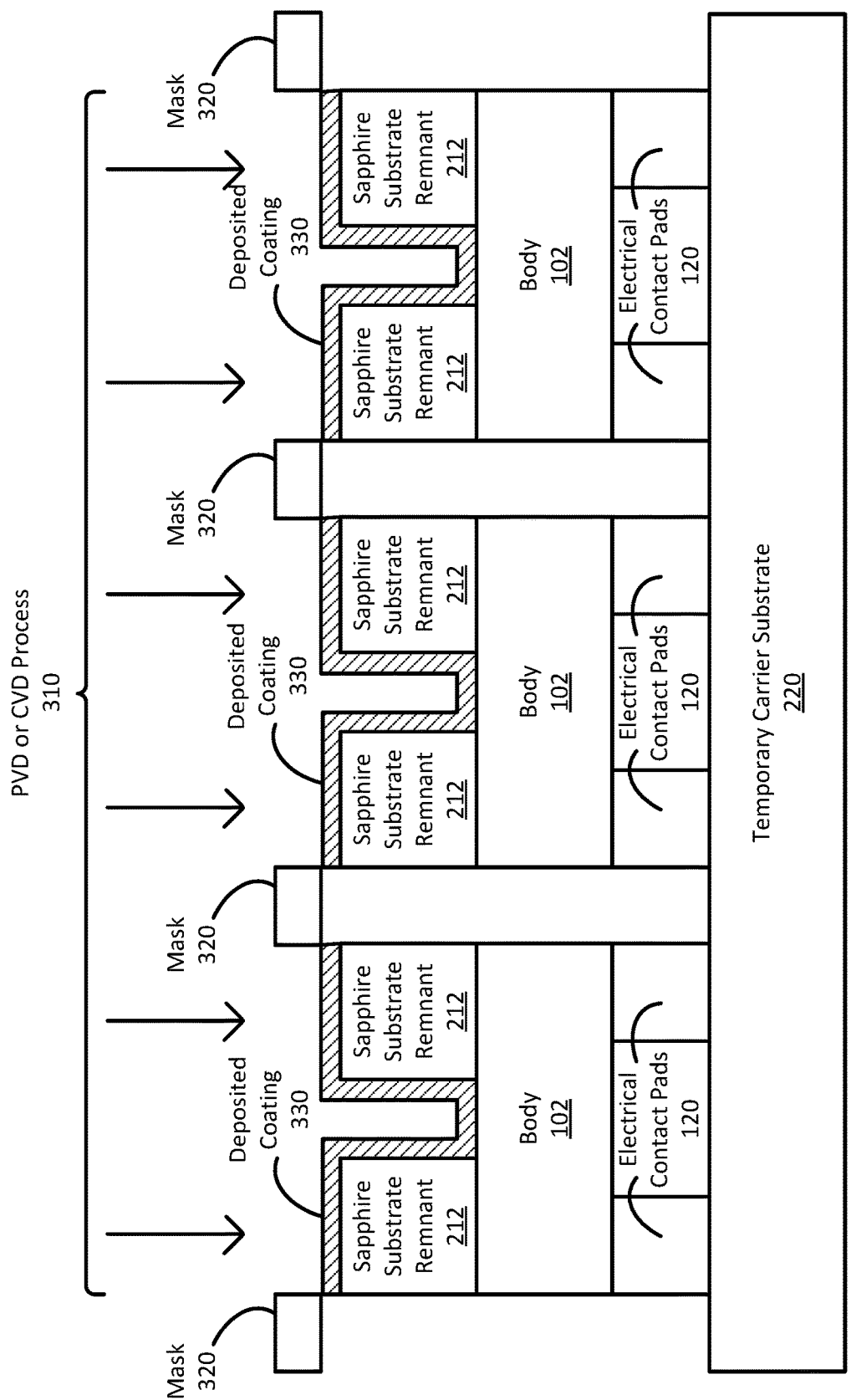
FIGS. 3A and 3B illustrate the set of μLEDs shown in FIGS. 2A through 2C at different stages of coating using a metal deposition process, in accordance with one embodiment.
Figure 3B:
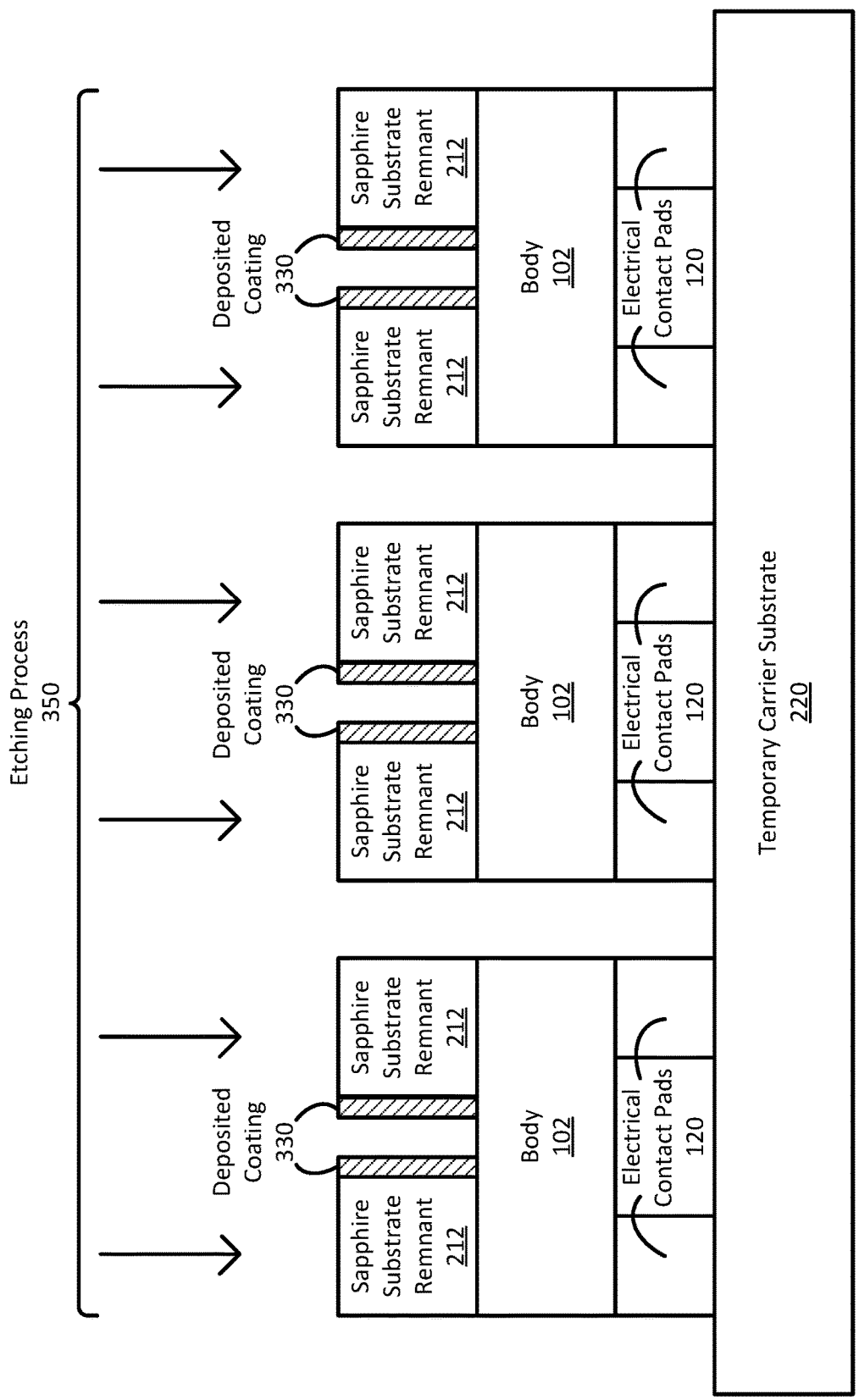

FIGS. 3A and 3B demonstrate another way of reducing crosstalk between adjacent μLEDs 100. In particular, the inner surface of the trenches 214 are coated with a thin layer of metal (e.g., silver or aluminum). This smooths the surfaces of the trenches 214, reducing scattering and increasing reflection. Thus, the amount of light leaving a trench 214 is reduced, decreasing the amount of crosstalk.

In the embodiment shown in FIG. 3A, the top and inner-side surfaces of the sapphire substrate remnants 212 are coated with metal 330 using physical vapor deposition (PVD) or chemical vapor deposition (CVD) technique 310. Examples of PVD techniques that may be used include sputtering, ion-beam evaporation, thermal evaporation, pulsed-laser deposition, and the like. Examples of CVD techniques that may be used include plasma-enhanced chemical vapor deposition, laser chemical vapor deposition, atomic layer deposition, and the like. The exposed portions of the body 102, which includes the light emitting area 112, are also coated with the metal 330. The areas between the μLEDs 100 are protected from being coated by the metal using a contact mask 320. For example, a grid with openings the size of the μLEDs 100 can be placed on top of the set of μLEDs.

After the metal coating 330 has been deposited, unwanted portions of the metal coating 330 are removed using an etching process 350, as illustrated in FIG. 3B. In the embodiment shown, the etching process 350 removes the metal coating 330 from the top surfaces of the sapphire substrate remnants 212 and the exposed portions of the body 102. Thus, the deposited metal coating 330 remains only on the inner walls of the trenches 214. However, in other embodiments, the metal coating 330 may remain elsewhere. In one embodiment, the etching process 350 is ion milling. Because the ions used are incident on the μLEDs 100 substantially parallel to the major axis of the trenches 214, the metal coating 330 on the sides of the trenches is largely unaffected while any metal on surfaces perpendicular to that is removed.

In an alternative embodiment, the metal deposition 310 and etching 350 are replaced by a targeted metal deposition step (not shown). The metal 330 is deposited using a method able to produce angled shadow deposition. Examples of such techniques include sputtering e-beam evaporation, thermal evaporation, and laser chemical vapor deposition. While the metal 330 is being deposited, the sample is rotated and tilted to avoid deposition on unwanted areas (e.g., the light emitting area 112).

Regardless of the precise manner in which the metal coating 330 is applied, it increases reflection, as noted above. This increased reflection reduces crosstalk between adjacent μLEDs 100 because less light leaves the trench 214 through the inner walls rather than exiting through the opening at the top of the trench.

Figure 4:
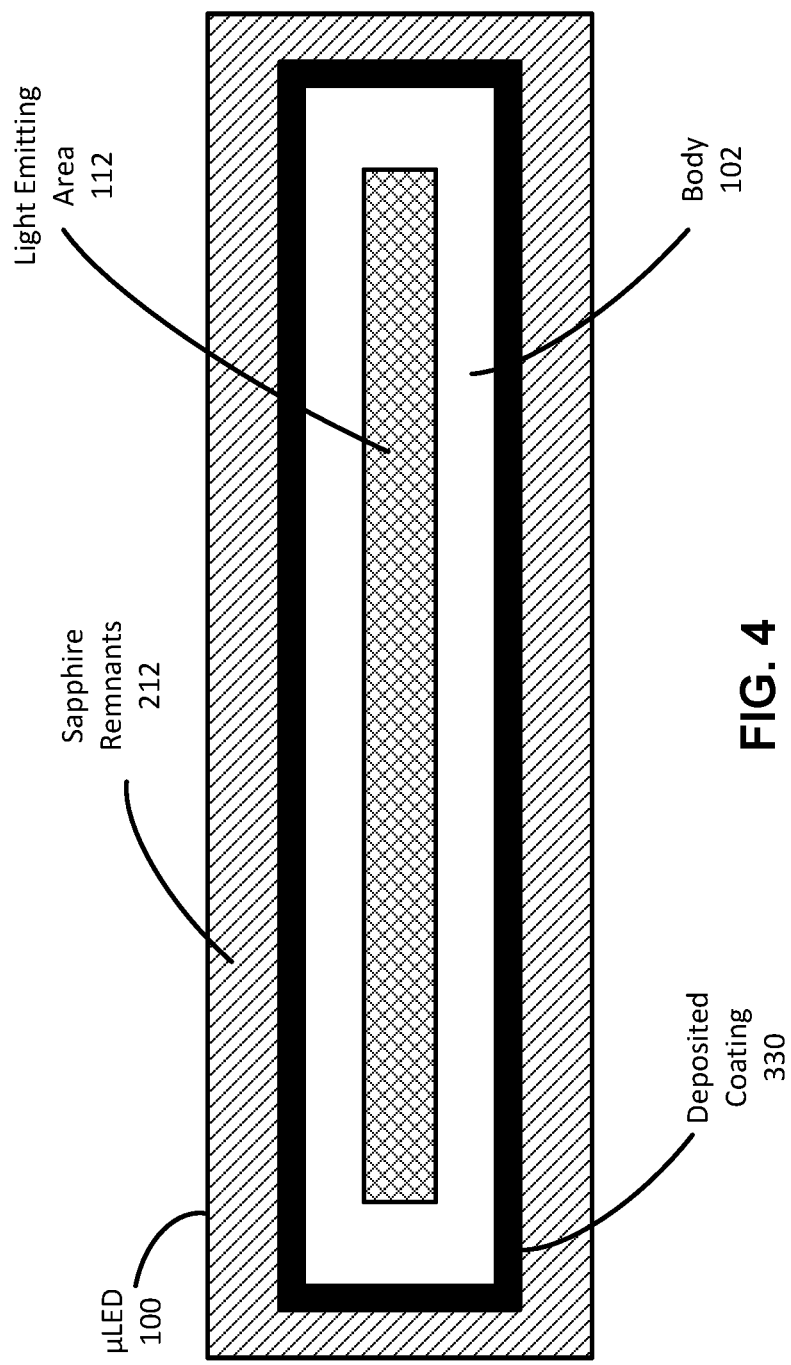
FIG. 4 is a top-down view of a μLED fabricated using a sapphire etching and metal deposition process, in accordance with one embodiment.

FIG. 4 is a top view of a μLED 100 with sapphire remnants 212, according to one embodiment. In the embodiment shown, the light emitting area 112 of the μLED 100 is rectangular. Looking down the major axis of the trench 214, the light emitting area 112 is surrounded by an exposed portion of the body 102 that does not emit light. In some embodiments, the light emitting area 112 may extend right to the wall of the trench 214. Surrounding the light emitting area 112 and exposed portion of the body 102 (where present) is the remnants 212 of the sapphire substrate 210, forming the trench 214. The inner walls of the trench are coated with the deposited metal 330.

FIG. 5 illustrates an alternative embodiment where the set of μLEDs 100 remain connected by sapphire 212 after the etching process has been performed. Although FIG. 5 shows all of the μLEDs 100 as connected, in some embodiments, subsets of μLEDs remain connected while the sapphire between others is completely removed. Leaving two or more μLEDs 100 connected in this manner makes it easier to transfer the set of μLEDs to a target substrate together. This maintains the distance between μLEDs 100 and can reduce the total number of move (e.g., pick and place) operations that need to be performed. That is, a set of μLEDs 100 connected by the sapphire substrate remnants 212 can be picked up as a unit and then be moved to the target substrate. In the embodiment shown in FIG. 5, the sapphire substrate 210 is partially etched between μLEDs 100 to form intermediate trenches 216. However, in other embodiments, no intermediate trenches are formed.

Figure 6A:
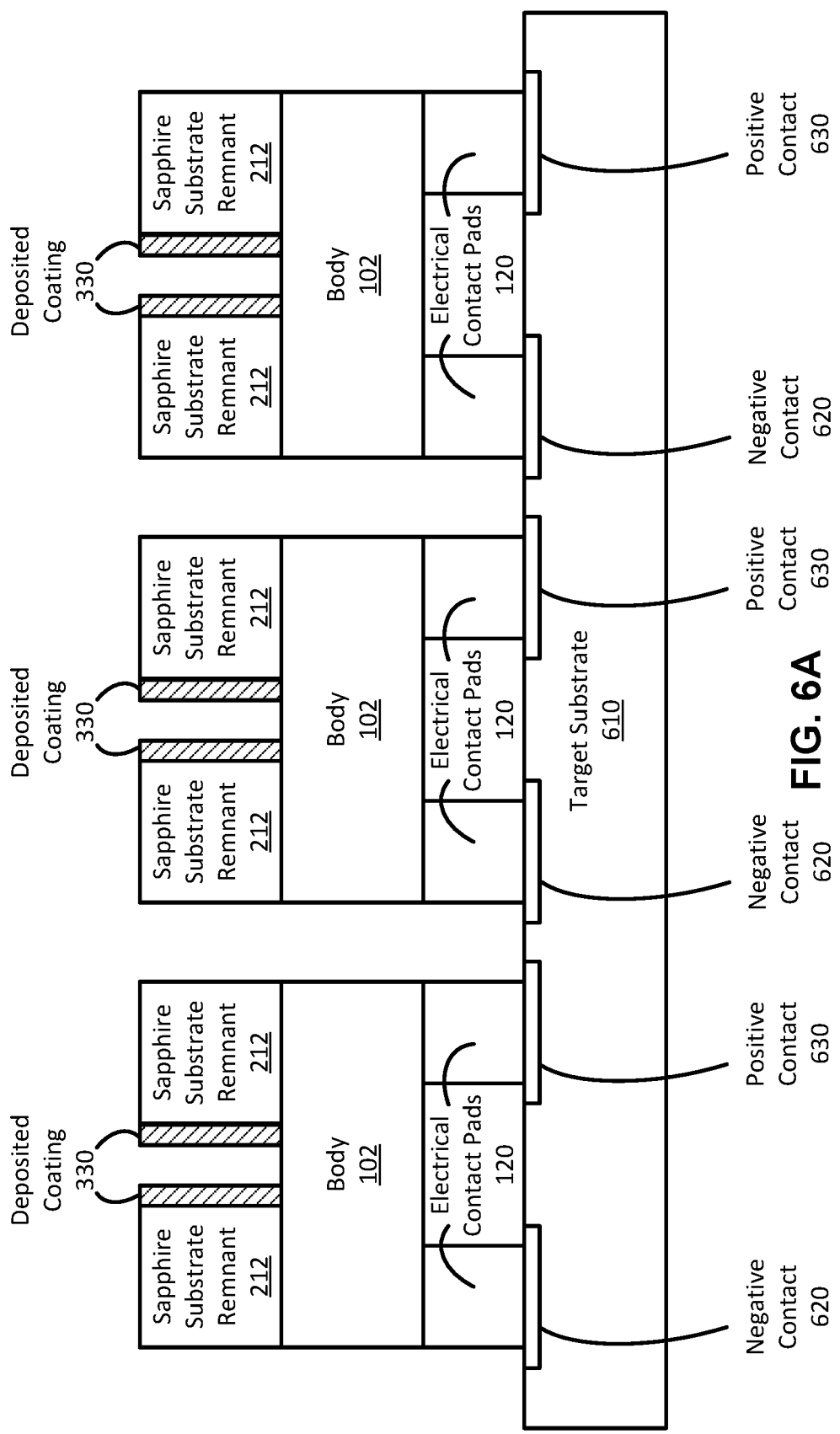
FIG. 6A illustrates a set of μLEDs that have been transferred to a target substrate, according to one embodiment.

FIG. 6A is a simplified representation of a set of μLEDs 100 that have been transferred to a target substrate 610 (e.g., a display substrate). Although only three of μLEDs 100 are shown, a typical display device will include many more (e.g., thousands of) μLEDs. The electrical contact pads 120 of each μLED 100 are connected to a pair of contacts (negative contact 620 and positive contact 630) on the target substrate 610. Consequently, current can be delivered to activate the μLEDs 100, causing them to emit light.

Figure 6B:
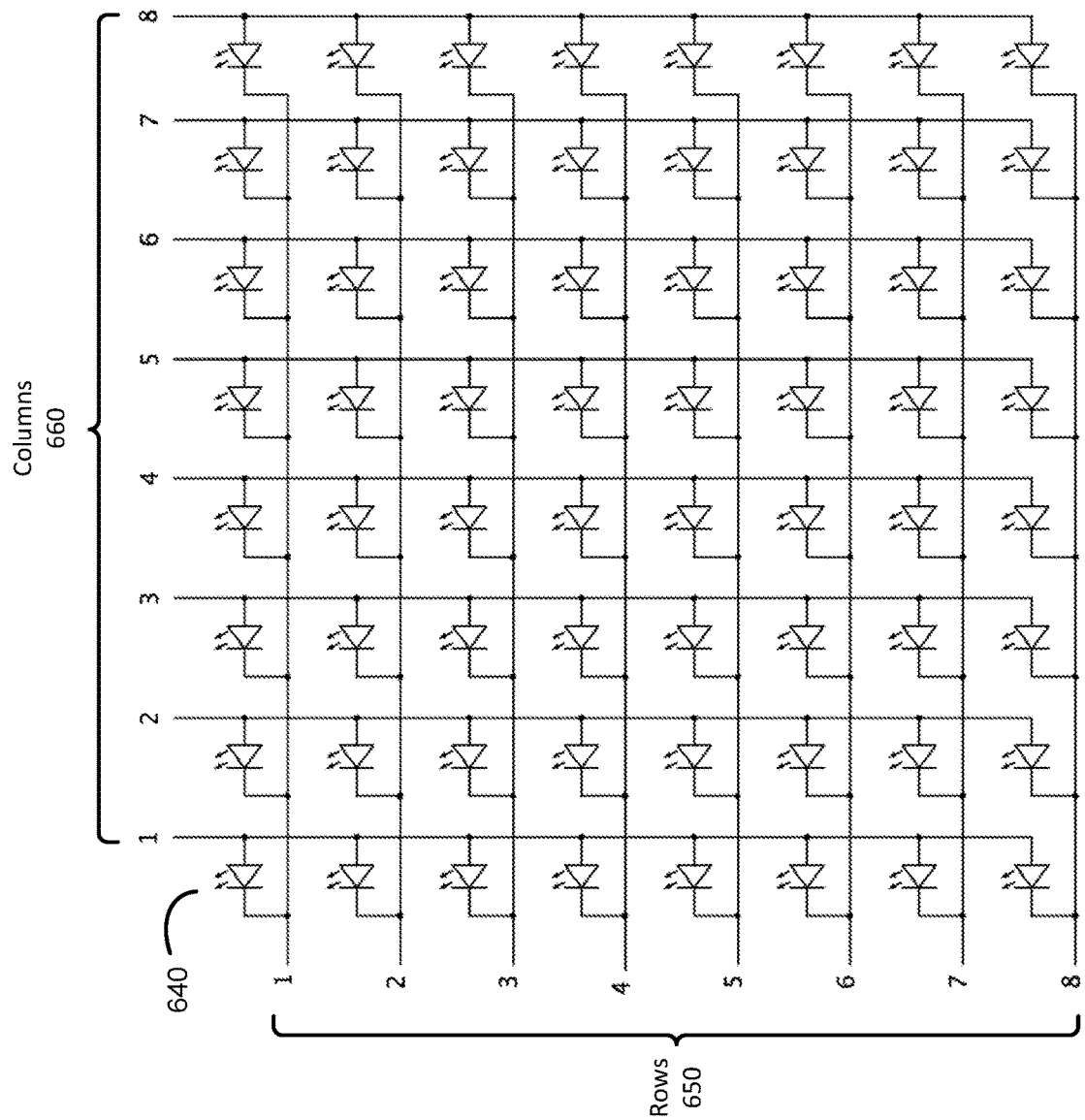
FIG. 6B illustrates a μLED display device, according to one embodiment.

FIG. 6B is a simple circuit diagram illustrating one embodiment of a display device using μLEDs 100. FIG. 6B shows a simple device with an eight by eight matrix of μLEDs 100 for illustrative purposes. However, in practice, display devices will typically include many more (e.g., thousands of) μLEDs 100. Each of the μLEDs 100 (e.g., μLED 640) is connected to two conduction lines: one of the rows 650 and one of the columns 660. The columns 660 connect the μLEDs 100 to a source of current and the rows 650 connect the μLEDs to a sink. Thus, for a given μLED 100, the corresponding row 650 and column 660 act as negative contact 620 and positive contact 630 shown in FIG. 6A, respectively.

Example Fabrication Methods

Figure 7:
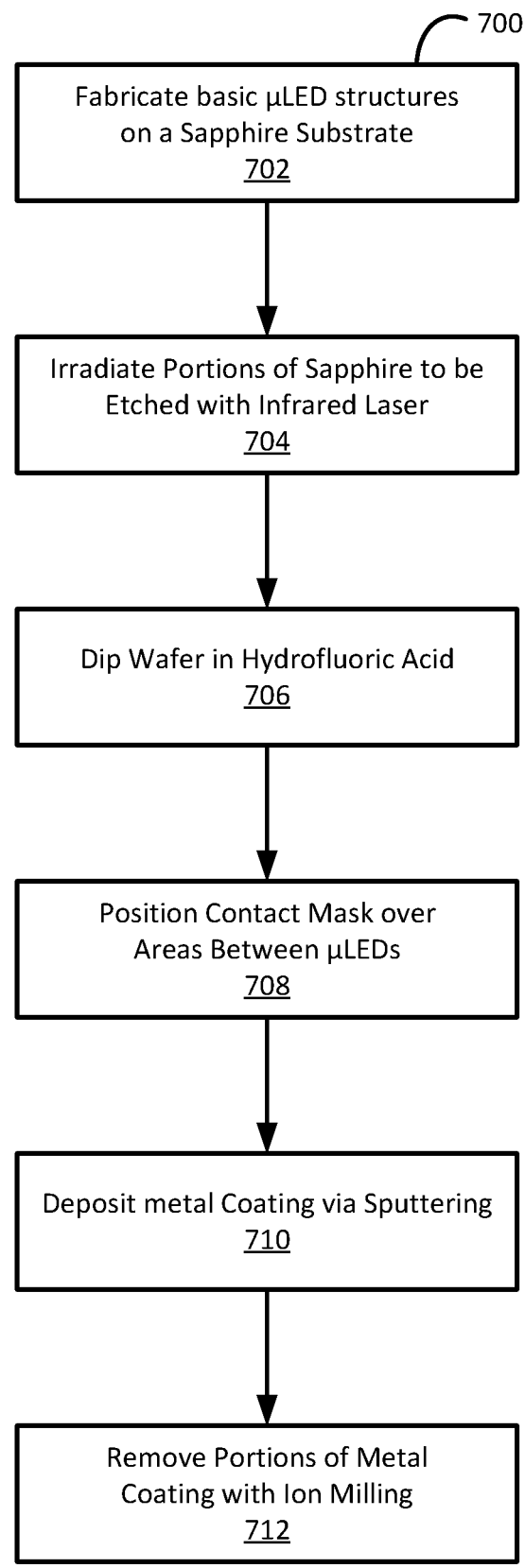
FIG. 7 is a flow-chart illustrating a method for fabricating a set of μLEDs using a sapphire etching and metal deposition process, according to some embodiments.

FIG. 7 illustrates a method 700 for fabricating μLEDs 100, according to one embodiment. FIG. 7 is illustrated from the perspective of single entity performing the steps of the method 700 consecutively. However, some or all of the steps may be performed by other entities or components. In addition, some embodiments may perform the steps in parallel, perform the steps in different orders, or perform different steps. For example, in some embodiments, the steps relating to metal coating (710 and 712) are omitted.

In the embodiment shown, the method 700 begins by fabricating 702 the basic structure of the μLEDs 100 on a sapphire substrate 210. As described above, this basic structure can include a pair of electrical contact pads 120 and a body 102 with a light emitting area 112. The portions of the sapphire substrate 210 to be removed are irradiated 704 with an IR laser. Alternatively, shorter wavelength lasers may be used. For example, a second harmonic generation laser with a wavelength in the visible spectrum and a pulse duration of the order of femtoseconds to picoseconds may be used. Next, the wafer (including the basic structure of the μLEDs 100) is dipped 706 in HF. The HF removes the portions of the sapphire substrate 210 that were irradiated 704 while leaving the remaining sapphire intact. Thus, the μLEDs 100 can be singulated and/or the trenches 214 formed. Additional features, such as intermediate trenches 216 can also be formed by the etching process.

In embodiments where a metal coating 330 is not used, the method 700 can end at this point. However, in the embodiment shown in FIG. 7, a contact mask 320 is positioned 708 over the areas between the μLEDs 100 and a metal (e.g., aluminum or silver) coating 330 is deposited 710 using a PVD or CVD process 310. Next, portions of the metal coating 330 are removed 712 using an etching process 360 such as ion milling. Thus, the inside surfaces of the trenches 214 can be coated in a thin layer of metal 330. In other embodiments, other methods of depositing 710 and removing 712 the coating 330 are used. For example, as described previously, a targeted deposition method that results in angled shadow deposition can be used to remove the need for the etching process 360. As another example, a contact mask 320 need not necessarily be used. The metal coating 330 may also be deposited and removed such that additional or different surfaces are covered.

Example Fabrication System

Figure 8:
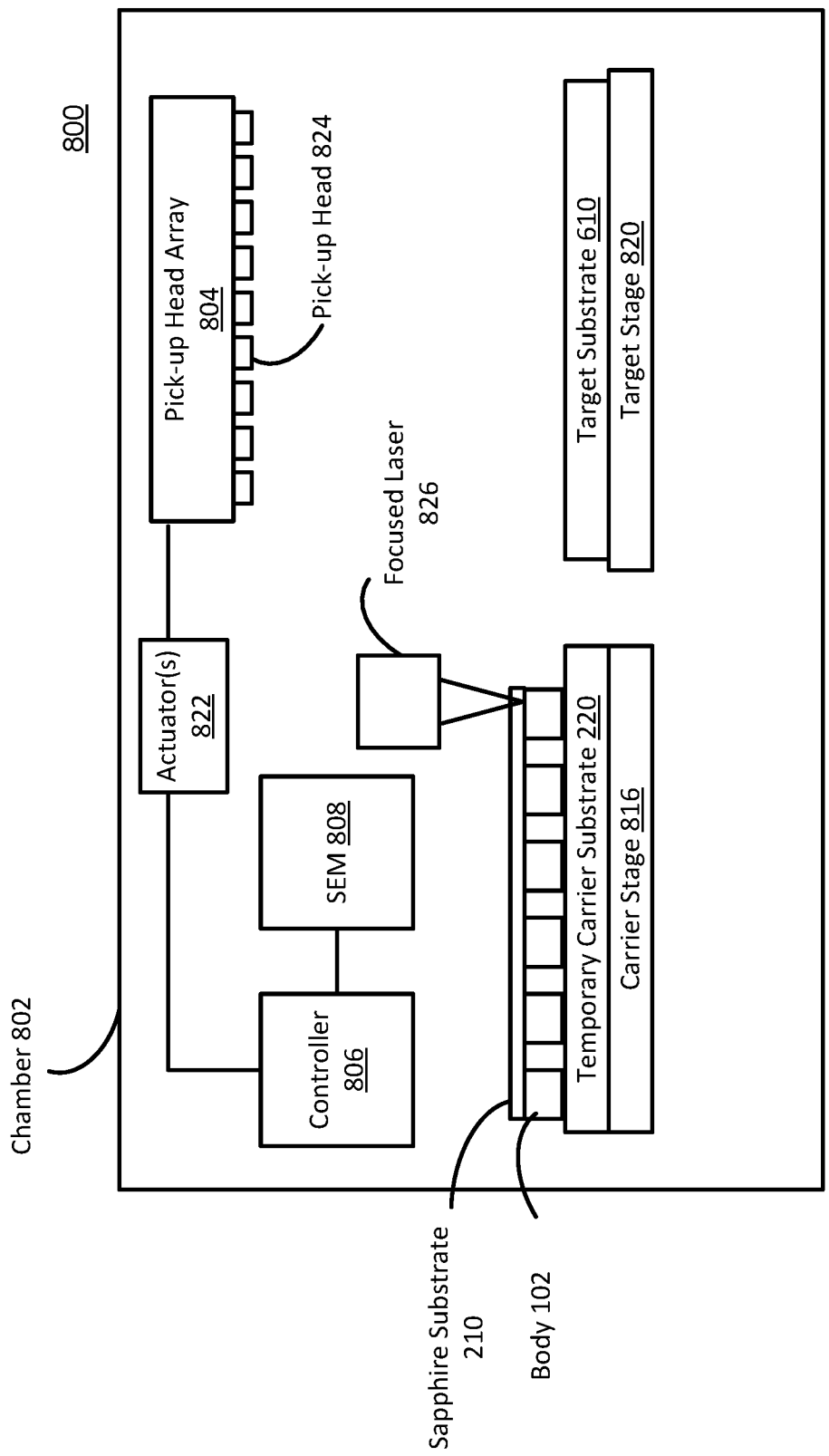
FIG. 8 is a schematic diagram illustrating a display fabrication system, in accordance with one embodiment

FIG. 8 is a block diagram illustrating a display fabrication system 800, in accordance with one embodiment. The system 800 assembles a display device by fabricating and transferring μLEDs 100 from a temporary carrier substrate 220 to a target substrate 610. Although FIG. 8 shows the fabrication and transfer occurring at a single location within a single system, in some embodiments, the fabrication (e.g., using the process illustrated by FIG. 7) and transfer occur in different locations and/or using different systems. For example, one system might be used to fabricate the μLEDs 100 before the temporary carrier substrate and μLEDs are moved to a second system to perform pick and place, assembling the display device.

In some embodiments, he temporary carrier substrate 220 may be a carrier film that holds the μLEDs 100 for pick up by the pick-up head array 804. The target substrate 610 may be a display substrate, or may be an intermediate carrier substrate that facilitates bonding with a display substrate. In one embodiment, the system 800 places and then bonds μLEDs 100 at pixel locations on the display substrate 610.

The system 800 may include, among other components, a scanning electron microscope (SEMS) chamber 802 defining an interior environment for picking and placing μLEDs 100 within the SEM chamber 802. The system 800 further includes a pick-up head array 804, a scanning electron microscope (SEM) 808, an actuator 822, a carrier stage 816, a target stage 820, and a focused laser beam 826, within the SEM chamber 802. The carrier stage 816 holds a temporary carrier substrate 220 having μLEDs 100. The target stage 820 holds a target substrate 610 to receive some or all of the μLEDs 100 from the temporary carrier substrate 220. A controller 706 is coupled to the SEM 808 and the pick-up head array 804 (e.g., via the actuator 822) and controls the operations of the SEM 808 and pick-up head array 804. For example, the controller 806 may cause the pick-up head array 804 to pick up one or more μLEDs 100 located on a temporary carrier substrate 220 and place them on the target substrate 610 as part of the pixels of a display.

The pick-up head array 804 can include several pick-up heads 824. Each pick-up head 824 can pick up a μLED 100 from the temporary carrier substrate 220 and place it on the target substrate 610. After picking up a μLED 100, the pick-up head 824 is aligned with a location on the target substrate 610. The pick-up head 824 is then places the μLED 100 at the location on the target substrate 610 before separating from the μLED 100.

In various embodiments, the actuator 822 is an electromechanical component that controls the movement of the pick-up head array 804 based on instructions from the controller 806. For example, the actuator 822 may move the pick-up head array 804 (or individual pick-up heads 824) with three degrees of freedom: up/down, left/right, and forward/backward. The actuator 822 may be embodied, for example, as a rotating motor, a linear motor, or a hydraulic cylinder.

The SEM 808 facilitates a visual alignment for μLED pick-up from the temporary carrier substrate 220 and alignment for μLED placement on the target substrate 610. The use of an SEM is advantageous for picking and place small devices, such as μLEDs 100. For example, the SEM 808 may generate images of the pick-up head array 804 and the temporary carrier substrate 220 and provide those images to the controller 806. The controller 806 aligns the one or more pick-up heads 824 of the pick-up head array 804 with the temporary carrier substrate 814 based on the images, and picks up one or more μLEDs 100 mounted on the temporary carrier substrate 220.

In another example, the SEM 808 generates images of the one or more pick-up heads 824 of the pick-up head array 804 and the target substrate 610, and provides the images to the controller 806. The controller 806 aligns the one or more pick-up heads 824 with the display substrate 610 based on the images, and places the μLEDs 100 attached to the one or more pick-up heads 824 on the display substrate 610. In some embodiments, the SEM 808 is an environmental scanning electron microscope (ESEM), which can provide images without specimen coating. The SEM chamber 802 is an ESEM chamber including a high pressure atmosphere of water vapor. In various embodiments, other types of imaging devices may be used to facilitate the alignments.

In some embodiments, the carrier stage 816 and/or target stage 820 may be adjusted to facilitate precision alignment with the pick-up head array 804. For example, the carrier stage 816 and/or target stage 820 may be moved with three degrees of freedom (e.g., left/right, backward/forward, and a rotational yaw). In such embodiments, the temporary carrier substrate 220 is moved with the carrier stage 816 and the display substrate 610 is moved with the target stage 820.

The system 800 may include one or more temporary carrier substrates 220. For example, different temporary carrier substrates 220 may carry different color μLEDs 100. A temporary carrier substrate 220 may be carrier film that holds singulated μLEDs 100 for transfer to the display substrate 610. The system 800 may also include one or more target substrates 610. In some embodiments, such as when the target substrate 610 is a display substrate for receiving μLEDs 100, the target stage 820 includes a heater for thermal conductive bonding of the electrical contact pads of the μLEDs 100 to the display substrate 610 subsequent to placement by the pick-up head 804. In other embodiments, the target substrate 610 is an intermediate carrier substrate that is used to facilitate direct bonding of μLEDs 100 with a separate display substrate 610 (e.g., using a direct bonding process).

In some embodiments, the system 800 includes multiple pick-up head arrays 804, each positioned at a separate station. Each station may be dedicated to the pick and place of a particular color μLED 100, such as a green station for green μLEDs, a red station for red μLEDs, and a blue station for blue μLEDs, etc.

The focused laser beam 826 is used to irradiate portions of the sapphire substrate 210 to determine which portions are removed during the etching process. In some embodiments, another laser (not shown) generates a laser beam to singulate the μLEDs 100 on the temporary carrier substrate 220. Multiple μLEDs 100 may be fabricated on a native substrate (e.g., the sapphire substrate 210) and singulated on the temporary carrier substrate 220. In some embodiments, a laser beam (not shown) is directed through the temporary carrier substrate 220 to facilitate pick up of the μLEDs 100. The temporary carrier substrate 220 may include a carrier tape or other adhesive layer to hold the μLEDs 100 in place with an adhesion force. The laser beam reduces the adhesion force so that the pick-up head array 804 can pick up the μLEDs 100 without breaking them. In some embodiments, the system 800 includes a mechanical dicer to singulate the μLEDs 100, such as a diamond based cutting wheel.

In some embodiments, the controller 806, in addition to controlling an alignment of the pick-up heads 824 of the pick-up head array 804 (e.g., using actuators 822), may also control a temperature of the chamber 802. In some embodiments, the controller 806 may alter the temperature of the chamber 802 to change a temperature of the μLEDs 100. For example, the controller 806 may operate one or more heating coils (not shown) in the chamber 802 to raise a temperature of the μLEDs 100. In other embodiments, the carrier stage 816 or another component may contain a heater able to directly heat one or more of the μLEDs 100. In some embodiments, the temperature of the chamber 802 may be controller using a separate temperature controller (not shown).

As used herein, any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

In addition, use of the "a" or "an" are employed to describe elements and components of the embodiments. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a μLED that includes remnants of a substrate on which it was fabricated and methods for fabricating such μLEDs. Thus, while particular embodiments and applications have been illustrated and described, it is to be understood that the described subject matter is not limited to the precise construction and components disclosed herein and that various modifications, changes and variations which will be apparent to those skilled in the art may be made in the arrangement, operation and details of the method and apparatus disclosed. The scope of protection should be limited only by the following claims.

The invention claimed is:

1. A light emitting diode device comprising:
   a body having semiconductor layers and at least one quantum well, the body having a top surface that includes a light emitting area and a non-light emitting area, wherein light generated in the semiconductor layers is emitted from the light emitting area;
   electrodes connected to the body at a side opposite the top surface to provide current to the body; and
   one or more remnants of a fabrication substrate on which the body was formed, the one or more remnants disposed on the non-light emitting area and defining a trench extending from a portion of the top surface of the body away from the electrodes, the trench exposing the light emitting area, wherein at least part of the light emitted through the light emitting area passes through the trench, wherein the fabrication substrate comprises sapphire.

2. The light emitting diode device of claim 1, wherein the body comprises a gallium semiconductor layer.

3. The light emitting diode device of claim 1, wherein the remnants of the fabrication substrate have a refractive index such that at least some of the light passing through the trench is reflected from an inner wall of the trench.

4. The light emitting diode device of claim 1, wherein the one or more remnants of the fabrication substrate have a rectangular footprint on the body and the trench also has a rectangular footprint on the body, the footprint of the trench being encompassed within the footprint of the one or more remnants of the fabrication substrate.

5. The light emitting diode device of claim 1, further comprising a metal coating disposed on an inner wall of the trench, the inner wall being substantially perpendicular to the top surface of the body.

6. The light emitting diode device of claim 5, wherein the metal coating comprises at least one of: aluminum or silver.

7. The light emitting diode device of claim 1, wherein the light emitting area has an area of less than 2,000 μm².

8. The light emitting diode device of claim 1, wherein the one or more remnants of the fabrication substrate connect the light emitting diode device to an adjacent light emitting diode device.

9. The light emitting diode device of claim 1, wherein the trench has a first end and a second end, the first end abutting the top surface of the body, and the trench extends away from the top surface of the body and the electrodes to the second end.

10. The light emitting diode device of claim 1, wherein the one or more remnants of the fabrication substrate provide structural support to the body.

11. A light emitting device comprising:
    a target substrate having a plurality of conduction lines; and
    a plurality of light emitting diode devices, each light emitting diode device comprising:
        a body having semiconductor layers and at least one quantum well, the body having a top surface that includes a light emitting area and a non-light emitting area, wherein light generated in the semiconductor layers is emitted,
        electrodes connected to the body at a side opposite the top surface, each electrode connected to one of the plurality of conduction lines, and
        one or more portions of a fabrication substrate on which the body was formed disposed on the top surface of the body, the one or more portions of the fabrication substrate disposed on the non-light emitting area and defining a trench extending from a portion of the top surface of the body away from the electrodes, the trench exposing the light emitting area, wherein at least part of the light emitted through the light emitting area passes through the trench, wherein the fabrication substrate comprises sapphire.

12. The light emitting device of claim 11, wherein, for a given light emitting diode device, the one or more portions of the fabrication substrate have a refractive index such that at least some of the light passing through the trench is reflected from an inner wall of the trench.

13. The light emitting device of claim 11, further comprising a metal coating disposed on an inner wall of the trench of a given light emitting device, the inner wall being substantially perpendicular to the top surface of the body.

14. The light emitting device of claim 13, wherein the metal coating comprises at least one of: aluminum or silver.

15. The light emitting device of claim 11, wherein the body of a given light emitting diode device comprises a gallium semiconductor layer.

16. The light emitting device of claim 11, wherein, for a given light emitting diode device, the one or more portions of the fabrication substrate have a rectangular footprint on the body and a first end of the trench also has a rectangular footprint on the body, the footprint of the first end of the trench being encompassed within the footprint of the one or more portions of the fabrication substrate.

17. The light emitting device of claim 11, wherein the trench has a first end and a second end, the first end abutting the top surface of the body, and the trench extends away from the top surface of the body and the electrodes to the second end.

18. The light emitting device of claim 11, wherein the one or more portions of the fabrication substrate connect a first one of the plurality of light emitting diode devices to a second one of the plurality of light emitting diode devices.

* * * * *